(12) United States Patent
Edholm

(10) Patent No.: US 6,485,309 B2
(45) Date of Patent: *Nov. 26, 2002

(54) VIRTUAL MIDPLANE TO ENHANCE CARD INTERCONNECTIONS USING A MATRIX OF INTERCONNECTING ASSEMBLIES

(75) Inventor: Philip K. Edholm, Fremont, CA (US)

(73) Assignee: Nortel Networks Limited, St. Laurent (CA)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 174 days.

(21) Appl. No.: 09/457,904

(22) Filed: Dec. 8, 1999

(65) Prior Publication Data

US 2001/0046794 A1 Nov. 29, 2001

(51) Int. Cl.$^7$ ................................................ H01R 12/00
(52) U.S. Cl. ........................................ 439/61; 361/805
(58) Field of Search ................................ 361/684, 686, 361/788, 790, 802–805, 413, 416; 439/61, 65, 79, 62, 63, 64, 633–640, 654, 655, 77, 67

(56) References Cited

U.S. PATENT DOCUMENTS

| | | |
|---|---|---|
| 4,686,607 A | 8/1987 | Johnson ...................... 361/788 |
| 4,703,394 A | 10/1987 | Petit et al. ................... 361/790 |
| 4,704,599 A | 11/1987 | Kummel et al. ............. 340/333 |
| 4,708,660 A * | 11/1987 | Claeys et al. ................. 439/65 |
| 4,876,630 A | 10/1989 | Dara ........................... 361/791 |
| 4,914,612 A | 4/1990 | Beece et al. .................. 703/15 |
| 5,036,473 A | 7/1991 | Butts et al. ................... 703/23 |
| 5,062,801 A | 11/1991 | Roos ............................. 434/61 |
| 5,109,353 A | 4/1992 | Sample et al. ................ 716/17 |
| 5,199,881 A * | 4/1993 | Oshita et al. .................. 439/65 |
| 5,324,206 A * | 6/1994 | Conroy-Wass ................ 439/77 |
| 5,329,470 A | 7/1994 | Sample et al. ................ 703/28 |
| 5,352,123 A | 10/1994 | Sample et al. ................ 439/61 |
| 5,429,521 A * | 7/1995 | Morlion et al. ............. 439/108 |
| 5,448,496 A | 9/1995 | Butts et al. ................... 716/16 |
| 5,452,231 A | 9/1995 | Butts et al. ................... 716/16 |
| 5,887,158 A | 3/1999 | Sample et al. ................ 716/15 |

* cited by examiner

Primary Examiner—Tulsidas Patel
Assistant Examiner—Son V. Nguyen
(74) Attorney, Agent, or Firm—Blakely Sokoloff Taylor & Zafman LLP

(57) ABSTRACT

The present invention is a method and apparatus for interconnection system. A first connector located on a first card provides first contacts for first signal traces on the first card. The first connector has a first housing enclosing the first contacts and a first extension portion. A second connector located on a second card provides second contacts for second signal traces on the second card. The second connector has a second housing enclosing the second contacts. The second connector is coupled to the first connector when the first and second housings are mated such that the first and second cards are substantially perpendicular to each other, the second card is aligned on the first extension portion.

15 Claims, 4 Drawing Sheets

VIRTUAL MIDPLANE TO ENHANCE CARD INTERCONNECTIONS USING A MATRIX OF INTERCONNECTING ASSEMBLIES

BACKGROUND

1. Field of the Invention

The present invention is related to interconnection systems. In particular, the present invention is related to virtual midplanes.

2. Description of Related Art

As data communication rates become higher and higher to meet demanding applications, interconnecting printed circuit boards (PCB) or cards in communication systems becomes more and more important. Signal transmission rate depends on a number of factors. One important factor is the length of the signal trace on the PCB. The shorter the length, the faster the signal can propagate. In addition, resistance and capacitance of the signal trace have impact on interconnecting system design. When the signal density is high, the interconnection of the signals for high speed applications becomes a challenge.

FIG. 1 shows a prior art interconnection system. For illustrative purposes, only two front cards are shown. The prior art system 100 includes two front cards 110 and 120, a midplane 130, and a rear card 140.

The front cards 110 and 120 have signal traces 118 and 128 and front connectors 115 and 125, respectively. The signal traces are terminated with contact points in the corresponding connectors. One objective of the interconnection system is to connect the signal traces 118 on the front card 110 to the corresponding signal traces 128 on the front card 120. The connectors 115 and 125 are typically full-length connectors having as many contact points as necessary to accommodate the interconnecting of the signal traces on the front cards.

The midplane has mating connectors 132 and 134 to mate with the front card connectors 115 and 125. The midplane 130 also has signal traces 138 running between the mating connectors 132 and 134 to form electrical connections for the contact points in the connectors 115 and 125. The rear card 140 provides additional area for signal traces. The rear card 140 is interfaced to the midplane via a rear connector.

The prior art system 100 has a number of disadvantages. First, the full-length configuration of the connectors 115 and 125 reduces the routing flexibility on the front cards 110 and 120 and the midplane 130. Second, the interconnecting signal trace lengths are long, resulting in higher propagation delay and lower speed. Third, there are two terminations at the two ports, resulting higher cost and additional delay due to additional capacitance and resistance. Fourth, the complexity and hardware cost for the midplane can be very high. The midplane may have many internal layers to accommodate all the interconnecting signals.

Therefore, there is a need to have an efficient technique for interconnecting cards in a high speed environment.

SUMMARY

The present invention is a method and apparatus for interconnection system. A first connector located on a first card provides first contacts for first signal traces on the first card. The first connector has a first housing enclosing the first contacts and a first extension portion. A second connector located on a second card provides second contacts for second signal traces on the second card. The second connector has a second housing enclosing the second contacts. The second connector is coupled to the first connector when the first and second housings are mated such that the first and second cards are substantially perpendicular to each other, the second card is aligned on the first extension portion. There is no need for an intermediate card and an additional connector.

According to one embodiment of the present invention, the first connector further has a first inter-card spacing portion to provide spacing between the first card and a third card positioned in a substantially parallel direction with the first card, and the second connector further has a second extension portion to provide alignment for the first card when the first and second connectors are coupled and a second inter-card spacing portion to provide spacing between the second card and a fourth card positioned in a substantially parallel direction with the second card.

The advantages of the invention include high signal transmission rates, increased interconnection reliability, high signal density, routing flexibility, balanced mechanical structure, and reduced overall mechanical stress.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

The features and advantages of the present invention will become apparent from the following detailed description of the present invention in which.

DESCRIPTION

Figure 1:
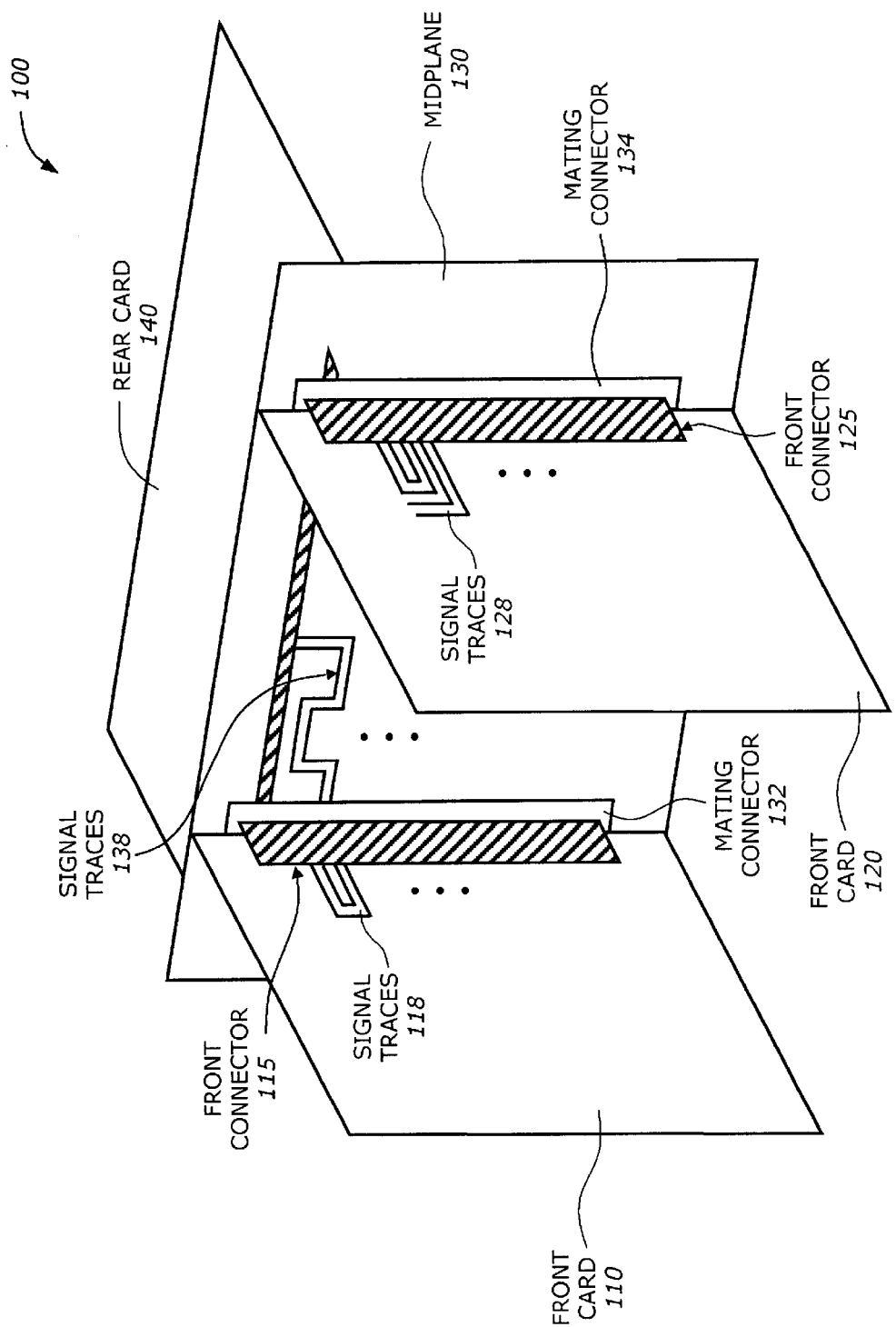
FIG. 1 is a diagram illustrating a prior art interconnection system.

The present invention is a method and apparatus for interconnection system. A first connector located on a first card provides first contacts for first signal traces on the first card. The first connector has a first housing enclosing the first contacts and a first extension portion. A second connector located on a second card provides second contacts for second signal traces on the second card. The second connector has a second housing enclosing the second contacts and a second extension portion. The second connector is coupled to the first connector when the first and second housings are mated such that the first and second cards are substantially perpendicular to each other, the second card is aligned on the first extension portion, and the first card is aligned on the second extension portion.

According to one embodiment of the present invention, the first connector further has a first inter-card spacing portion to provide spacing between the first card and a third card positioned in a substantially parallel direction with the first card, and the second connector further has a second extension portion to provide alignment for the first card when the first and second connectors are coupled and a second inter-card spacing portion to provide spacing between the second card and a fourth card positioned in a substantially parallel direction with the second card.

Using the above interconnecting assembly, "a virtual midplane" is formed by K first cards and N second cards installed in a chassis or a card cage. The K first cards are positioned in a substantially parallel direction to one another, each having first signal traces on each of the K first cards. The N second cards are coupled to the K first cards via a matrix of N×K connecting assemblies to electrically connect the first signal traces among the K first cards, each of the N second cards having second signal traces. The N second cards are positioned in a substantially parallel direction to one another. Each of the N×K connecting assemblies comprising first and second connectors. The first connector is located on one of the K first cards to provide first contacts for the first signal traces on the one of the K first cards. The first connector has a first housing enclosing the first contacts and a first extension portion. The second connector is located on one of N second cards to provide second contacts for the second signal traces on the one of N second cards, the second connector having a second housing enclosing the second contacts and a second extension portion. The second connector is coupled to the first connector when the first and second housings are mated such that the one of the K first cards and the one of N second cards are substantially perpendicular to each other, the one of N second cards being aligned on the first extension portion, and the one of the K first cards being aligned on the second extension portion.

In the following description, numerous specific details are set forth in order to provide a thorough understanding of the present invention. It will be apparent, however, to one of ordinary skill in the art that the present invention may be practiced without these specific details. In other instances, well-known architectures, steps, and techniques have not been shown where unnecessary for an understanding of the present invention. For example, specific details are not provided as to whether the method is implemented in a station as a software routine, hardware circuit, firmware, or a combination thereof.

Figure 2:
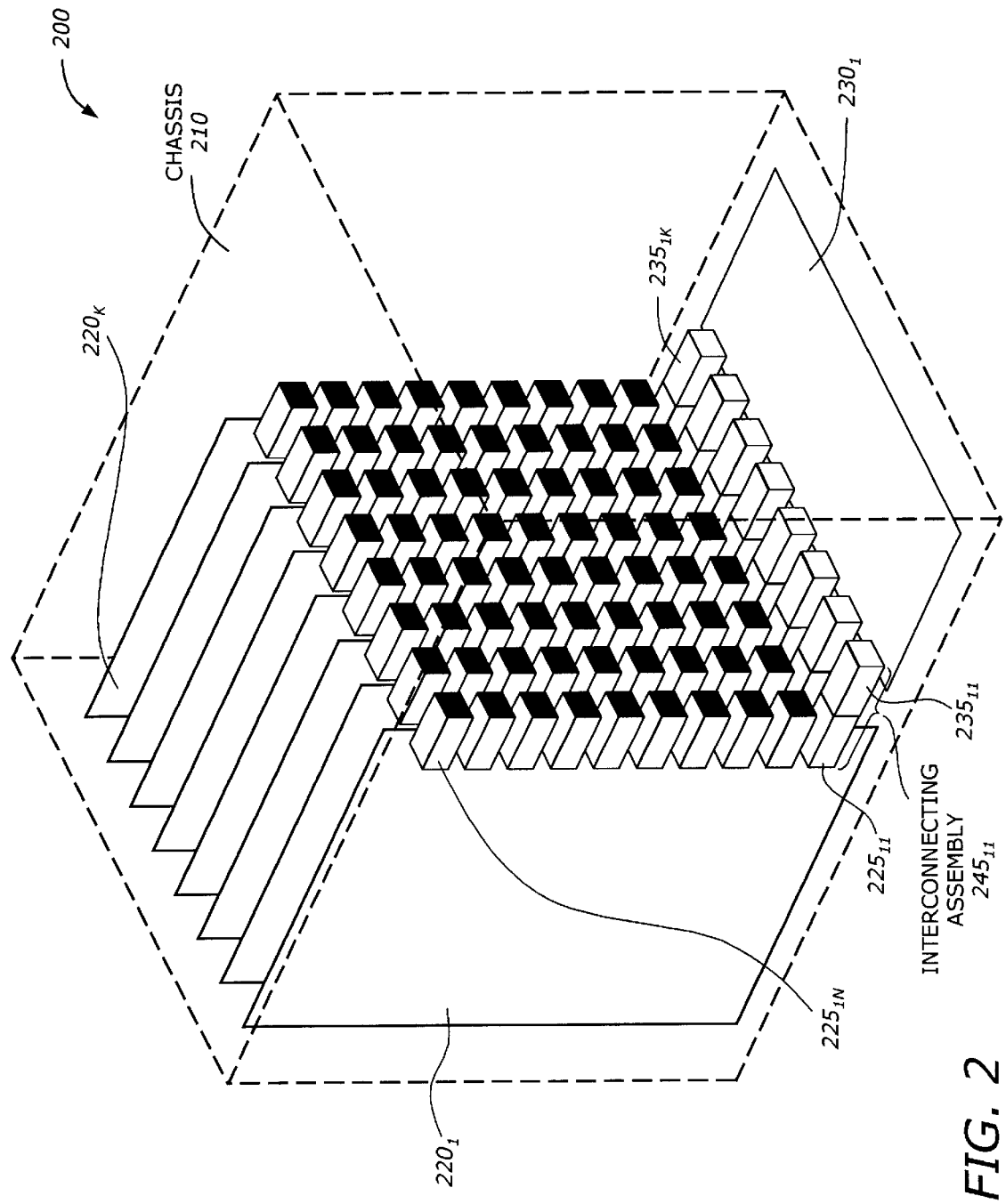
FIG. 2 is a diagram illustrating an interconnection system using a partial virtual midplane according to one embodiment of the invention.

FIG. 2 is a diagram illustrating an interconnection system 200 using a partial virtual midplane of one set of cards according to one embodiment of the invention. The interconnection system 200 includes a chassis 210, K first or front cards 220$_1$ to 220$_K$, and one second or rear card 230$_1$. As cards of one dimension are added, they form the virtual midplane.

The chassis 201 is a card cage, housing, or enclosure that houses all the electronic and/or mechanical subsystems of a system. The chassis 201 has spaces for power supplies, ventilation subsystem, connectors, cable assemblies, and interconnecting boards or cards. For clarity, only the interconnecting cards are shown. The chassis 200 typically includes card guides (not shown) that hold the cards firmly in place.

The K first cards 220$_1$ to 220$_K$ are typically multi-layered printed circuit boards (PCB's) that carry components such as electronic devices, processors, memories, and other integrated circuits (IC's). In one embodiment, the K first cards 220$_1$ to 220$_K$ are switch fabric cards used in a communication system. The switch fabric cards have many switching elements, such as gigabit Ethernet switches and high-speed telecommunication switches. The K first cards 220$_1$ to 220$_K$ are typically positioned in a substantially parallel direction to one another as typical in a chassis. The K first cards 220$_1$ to 220$_K$ have many signal traces running on the multi layers of the printed circuit boards that electrically connect the components. Signal traces on one card may need to be connected to those on another.

Figure 3:
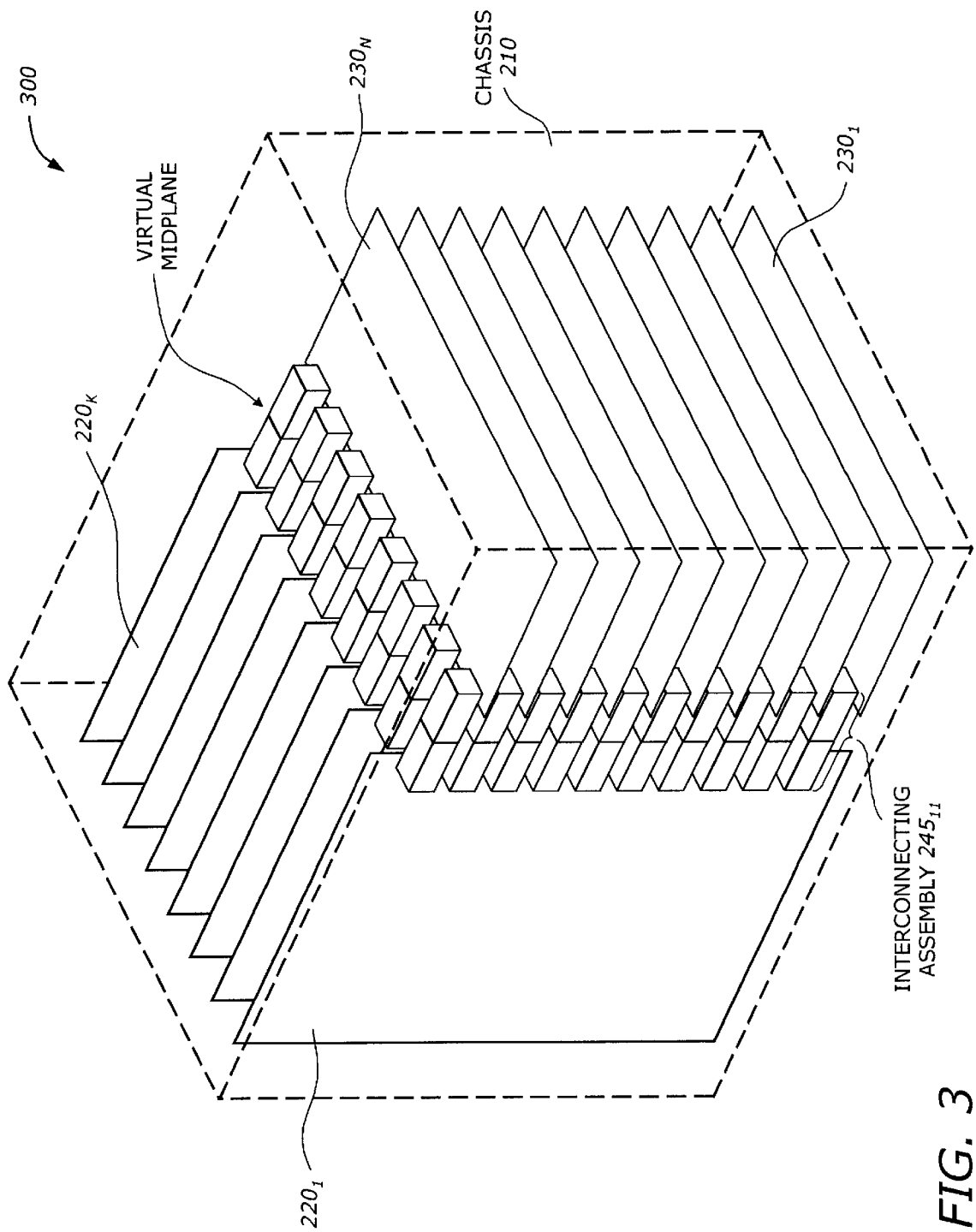
FIG. 3 is a diagram illustrating an interconnection system using a complete virtual midplane according to one embodiment of the invention.

Each of the K first cards 220$_1$ to 220$_K$ has N connectors located at the interconnecting side of the PCB. For example, the first card 220$_1$ has N connectors 225$_{11}$ to 225$_{1N}$. A first card 220$_k$ has N connectors 225$_{k1}$ to 225$_{kN}$. Although the numbers of connectors on the K first cards do not have to be the same, having the same number of connectors 225$_{kn}$ on each card provides better mechanical stability when a full virtual midplane is constructed as shown in FIG. 3.

Each of the connector 225$_{kn}$ has contacts for a group of signal traces that are connected to signal traces on other cards. The signal traces are distributed over the N connectors. The distribution of signal traces provides flexibility in signal routing and reduces noise caused by trace length and cross talks. The connectors 225$_{kn}$ where k=1, . . . , n and k=1, . . . , N on K first cards form a matrix of K×N connectors corresponding to half of the virtual midplane. The matrix K×N is formed by K rows and N columns when the K first cards are positioned in a vertical direction. As is known by one skilled in the art, the K first cards 220$_1$ to 220$_K$ may be positioned in a horizontal direction.

The second card 230$_1$ is a PCB that provides interconnecting signal traces for the K first cards. The second card 203$_1$ has K connectors 235$_{11}$ to 235$_{1K}$ located at the interconnecting side of the PCB. The second card 230$_1$ is positioned in a substantially perpendicular direction to the K first cards 220$_1$ to 220$_K$ and aligned to row 1 of the K first cards 220$_1$ to 220$_K$. The positioning of the second card 230$_1$ enhances the mechanical stability of the overall interconnection system by locking the K first cards 220$_1$ to 220$_K$ firmly together horizontally when the K first cards 220$_1$ to 220$_K$ are positioned vertically in the chassis.

Each of the connectors has contacts for signal traces on the second card 230$_1$ to electrically connect the signal traces at the contacts of the connectors 225$_{11}$, 225$_{21}$, 225$_{31}$, . . . , 225$_{K1}$. Typically, the second card 230$_1$ mostly contains interconnecting signal traces, not circuit elements or devices. In addition, the signal traces on the second card 230$_1$ electrically connect only one row of the K first cards 220$_1$ to 220$_K$. Therefore, the second card 230$_1$ has low signal density and the routing pattern can be flexible, resulting in low cost and high reliability.

The connector-pair between a connector on each of the K first cards 220$_1$ to 220$_K$ and a connector on the second card 230$_1$ form an interconnecting assembly. For example, the connector 225$_{11}$ on the first card 220$_1$ is coupled to the connector 235$_{11}$ on the second card 230$_1$ to form an interconnecting assembly 245$_{11}$. Each of the interconnecting assemblies is one element of the virtual midplane.

FIG. 3 is a diagram illustrating an interconnection system 300 using a complete virtual midplane according to one embodiment of the invention. The interconnection system 300 includes the chassis 200, the K first or front cards 220$_1$ to 220$_K$, and N second or rear cards 230$_1$ to 230$_N$.

The K first cards 220$_1$ to 220$_K$ are positioned in a substantially perpendicular or orthogonal direction to the N second cards 230$_1$ to 230$_N$. The K first cards 220$_1$ to 220$_K$ are positioned in a substantially parallel direction to one another. Similarly, the N second cards 230$_1$ to 230$_N$ are positioned in a substantially parallel direction to one another. Therefore, when the K first cards 220$_1$ to 220$_K$ are positioned in a vertical direction, as shown in FIG. 3, the N second cards 230$_1$ to 230$_N$ are positioned in a horizontal direction. When the K first cards 220$_1$ to 220$_K$ are positioned in a horizontal direction, the N second cards 230$_1$ to 230$_N$ are positioned in a vertical direction.

The connectors $225_{kn}$ on the K first cards are coupled to the corresponding connectors $235_{kn}$ on the N second cards, where k=1, ..., K and n=1, ..., N. Each of the connector pairs $225_{kn}$ and $235_{kn}$ forms an interconnecting assembly $245_{kn}$. A matrix of K×N interconnecting assemblies $245_{kn}$ (where k=1, ..., N and n=1, ..., N) essentially forms the virtual midplane that interconnects the K first cards $220_1$ to $220_K$ and the N second cards $230_1$ to $230_N$.

Each of the N second cards $230_1$ to $230_N$ has signal traces that electrically connect the signal traces on the corresponding row of the K first cards $220_1$ to $220_K$. The insertion of each of the N second cards $230_1$ to $230_N$ is facilitated by the corresponding row of the interconnecting assemblies.

The virtual midplane as formed by the matrix K×N of the interconnecting assemblies $245_{kn}$ (where k=1, ..., K and n=1, ..., N) provides a number of advantages. First, the single connectors on the first card 220 reduce the distances between active devices communicating over the interface, thereby reducing propagation delays and increase signal bandwidth. Second, the number of pins or contacts is significantly reduced, resulting in higher reliability. Third, the mechanical stability of interconnecting the cards is enhanced. Fourth, the mechanical stress is reduced due to distribution of card insertion over the entire matrix. Fifth, the routing of the signal traces on the PCBs of the first cards and the second cards is flexible because there are more interconnecting locations, resulting in low cost in routing and fabrication. Sixth, the signal density is increased due the distribution of contacts over larger area so that complex cards can be accommodated.

Figure 4:
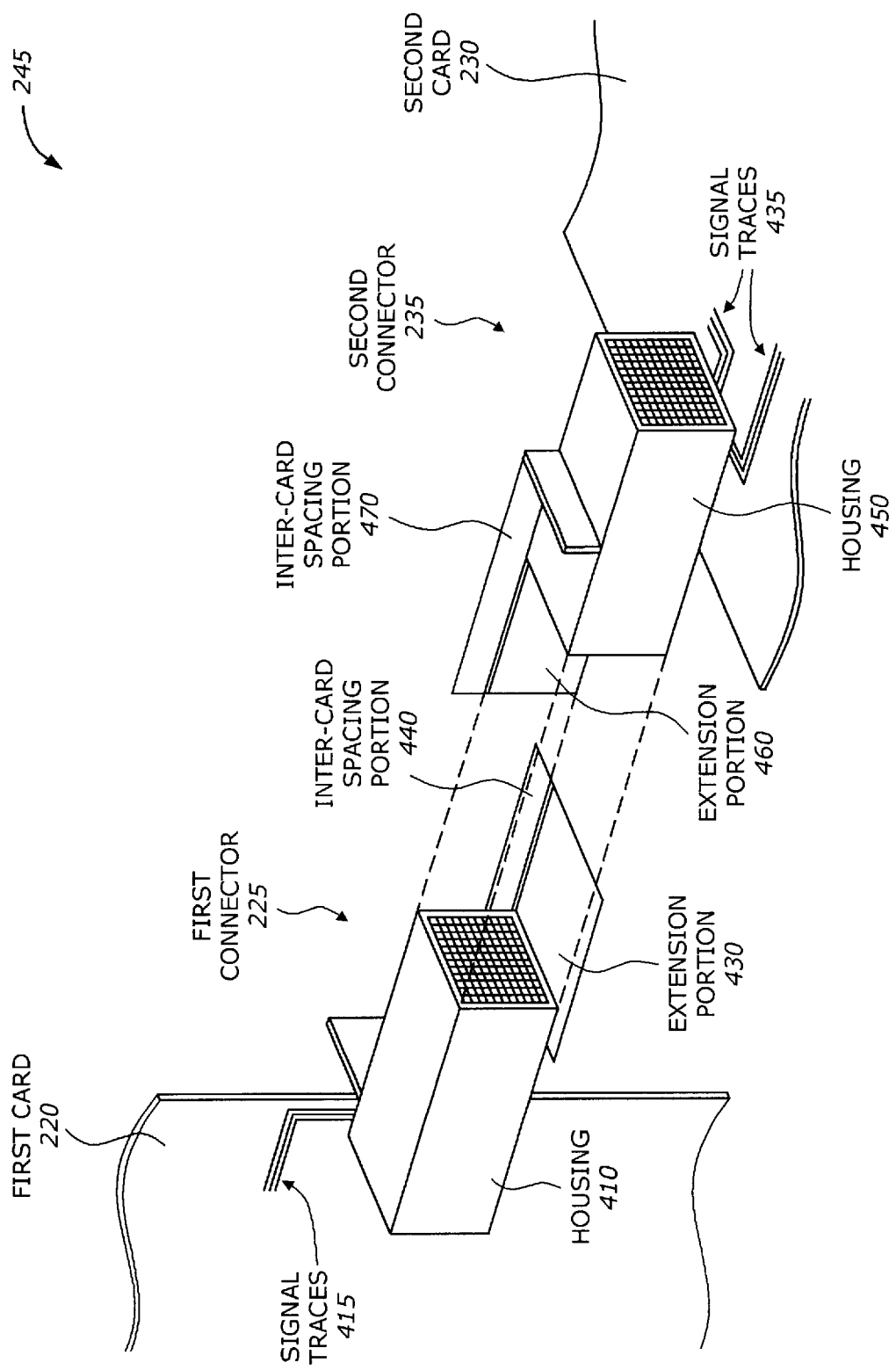
FIG. 4 is a diagram illustrating an interconnecting assembly used in the virtual midplane shown in FIGS. 2 and 3 according to one embodiment of the invention.

FIG. 4 is a diagram illustrating an interconnecting assembly 245 used in the virtual midplane shown in FIGS. 2 and 3 according to one embodiment of the invention. The interconnecting assembly 245 includes the first connector 225 and the second connector 235.

The first connector 225 is located on the first card 220 to provide contacts for signal traces 415 on the first card 220. The first connector 225 includes a first housing 410, a first extension portion 430, and a first inter-card spacing portion 440.

The first housing 410 encloses the contacts to the signal traces 415. A portion of the first housing 410 resides on the edge of the first card 220 to receive the signal traces 415. Typically, there is a contact area on the card where the signal traces are terminated. The first housing 410 provides contacts to be connected to the terminating signal traces by conventional methods such as soldering. The first housing 410 may have any convenient shape and form. For illustrative purposes, the first housing 410 is shown in FIG. 4 to have a rectangular or square shape. The first housing 410 has another portion used to mate to the second connector 235.

The first extension portion 430 is located below the first housing 410 underneath the mating portion of the housing 410. The first extension portion 430 may be a flat surface to guide the second connector 235 such that the second card 230 is properly aligned when it is plugged to couple with the first card 220 in a substantially perpendicular direction.

The first inter-card spacing portion 440 provides a space between adjacent cards when they are positioned in a substantially parallel position to each other. The first inter-card spacing portion 440 is dimensioned to fit with the card cage guides in the chassis.

The second connector 235 is located on the second card 230 to provide contacts for signal traces 435 on the second card 230. The second connector 235 includes a second housing 450, a second extension portion 460, and a second inter-card spacing portion 470.

The second housing 450 encloses the contacts to the signal traces 435. A portion of the second housing 450 resides on the edge of the second card 230 to receive the signal traces 435. Typically, there is a contact area on the card where the signal traces are terminated. The second housing 450 provides contacts to be connected to the terminating signal traces by conventional methods such as soldering. The second housing 450 may have any convenient shape and form compatible with the first housing 410 of the first connector 225. For illustrative purposes, the second housing 450 is shown in FIG. 4 to have a rectangular or square shape. The second housing 450 has another portion used to mate to the first connector 225.

The second extension portion 460 is located immediately on a side of the second housing 450 next to the mating portion of the second housing 450. The second extension portion 460 may be a flat surface to guide the first connector 225 such that the first card 220 is properly aligned when it is plugged to couple with the second card 230 in a substantially perpendicular direction.

The second inter-card spacing portion 470 provides a space between adjacent cards when they are positioned in a substantially parallel position to each other. The second inter-card spacing portion 470 is dimensioned to fit with the card cage guides in the chassis.

When the second connector 235 is coupled to the first connector 225, the first and second housings 410 and 450 are mated such that the first and second cards 225 and 235 are substantially perpendicular to each other. The second card 230 is aligned on the first extension portion 430 and the first card is aligned on the second extension portion 460. In addition, when the cards are fully populated as shown in FIG. 3, the first and second inter-card spacing portions 440 and 470 provide guided spacing between adjacent cards when they are inserted into the chassis.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An interconnection assembly comprising:

a first connector located on a first card to provide first contacts for first signal traces on the first card, the first connector having a first housing enclosing the first contacts and a first extension portion underneath the first housing; and a second connector located on a second card to provide second contacts for second signal traces on the second card, the second connector having a second housing enclosing the second contacts and a second extension portion on a side of the second housing; and wherein the second connector is coupled to the first connector when the first and second housings are mated such that the first and second cards are substantially perpendicular to each other, the second card being aligned on the first extension portion underneath the first housing and the first card being aligned on the second extension portion on the side of the second housing.

2. The interconnection assembly of claim 1 wherein the first connector further has a first inter-card spacing portion to provide spacing between the first card and a third card positioned in a substantially parallel direction with the first card.

3. The interconnection assembly of claim 1 wherein the first and second extension portions are substantially perpendicular when the first and second connectors are coupled.

4. The interconnection assembly of claim 3 wherein the second connector further has a second inter-card spacing portion to provide spacing between the second card and a fourth card positioned in a substantially parallel direction with the second card.

5. The interconnection assembly of claim 4 wherein the first and second connectors have substantially similar dimensions.

6. A method for interconnecting first and second cards, the method comprising:

providing first contacts for first signal traces on the first card by a first connector located on the first card, the first connector having a first housing enclosing the first contacts and a first extension portion underneath the first housing;

providing second contacts for second signal traces on the second card by a second connector located on the second card, the second connector having a second housing enclosing the second contacts and a second extension portion on a side of the second housing; and mating the first and second housings such that the first and second cards are substantially perpendicular to each other, the second card being aligned on the first extension portion underneath the first housing and the first card being aligned on the second extension portion on the side of the second housing.

7. The method of claim 6 further comprising:

spacing between the first card and a third card by a first inter-card spacing portion in the first connector, the third card being positioned in a substantially parallel direction with the first card.

8. The method of claim 7 further comprising:

aligning the first card on the second extension portion in the second connector such that the first and second extension portions are substantially perpendicular when the first and second housings are mated.

9. The method of claim 8 further comprising:

spacing between the second card and a fourth card by a second inter-card spacing portion in the second connector, the fourth card being positioned a substantially parallel direction with the second card.

10. The method of claim 9 wherein the first and second connectors have identical dimensions.

11. A system comprising:

K first cards positioned in a substantially parallel direction to one another, each of the K first cards having first signal traces; and N second cards coupled to the K first cards via a matrix of N×K connecting assemblies to electrically connect the first signal traces among the K first cards, each of the N second cards having second signal traces, the N second cards being positioned in a substantially parallel direction to one another, each of the N×K connecting assemblies comprising:

a first connector located on one of the K first cards to provide first contacts for the first signal traces on the one of the K first cards, the first connector having a first housing enclosing the first contacts and a first extension portion underneath the first housing, and a second connector located on one of N second cards to provide second contacts for the second signal traces on the one of N second cards, the second connector having a second housing enclosing the second contacts and a second extension portion on a side of the second housing, and wherein the second connector is coupled to the first connector when the first and second housings are mated such that the one of the K first cards and the one of N second cards are substantially perpendicular to each other, the one of the N second cards being aligned on the first extension portion underneath the first housing and the one of the K first cards being aligned on the second extension portion on the side of the second housing.

12. The system of claim 11 wherein the first connector further has a first inter-card spacing portion to provide spacing between the one of the K first cards and another one of the K first cards positioned in a substantially parallel direction with the one of the K first cards.

13. The system of claim 12 wherein the first and second extension portions are substantially perpendicular when the first and second connectors are coupled.

14. The system of claim 13 wherein the second connector further has a second inter-card spacing portion to provide spacing between the one of the N second cards and another one of the N second cards positioned in a substantially parallel direction with the one of the N second cards.

15. The system of claim 14 wherein the first and second connectors have identical dimensions.

* * * * *